United States Patent
Dinh et al.

(10) Patent No.: US 8,994,424 B2
(45) Date of Patent: Mar. 31, 2015

(54) DISTRIBUTING MULTIPLEXING LOGIC TO REMOVE MULTIPLEXOR LATENCY ON THE OUTPUT PATH FOR VARIABLE CLOCK CYCLE, DELAYED SIGNALS

(71) Applicant: International Business Machines Corporation, Armonk, NY (US)

(72) Inventors: Huu N. Dinh, Cedar Park, TX (US); Robert S. Horton, Colchester, VT (US); Bill N. On, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/797,252

(22) Filed: Mar. 12, 2013

(65) Prior Publication Data

US 2014/0266356 A1    Sep. 18, 2014

(51) Int. Cl.
*H03L 7/00*    (2006.01)
*H03K 5/159*    (2006.01)

(52) U.S. Cl.
CPC ..................................... *H03K 5/159* (2013.01)
USPC .......................................... 327/161; 327/141

(58) Field of Classification Search
CPC ........... H03L 7/08; H03L 7/06; H03L 7/0814; H03L 7/089; H03L 7/07; H03L 7/00; H03L 7/0802; H03L 7/0805; H03L 7/081; H03L 7/0818
USPC ........... 327/105–107, 141–163; 375/371–376
See application file for complete search history.

(56) References Cited

U.S. PATENT DOCUMENTS

| | | | |
|---|---|---|---|
| 6,441,657 B1 | 8/2002 | Saeki | |
| 7,336,752 B2 * | 2/2008 | Vlasenko et al. | 375/376 |
| 7,701,802 B2 | 4/2010 | Vergnes et al. | |
| 2012/0269017 A1 | 10/2012 | Hwang | |

FOREIGN PATENT DOCUMENTS

| | | |
|---|---|---|
| JP | 05020887 A | 1/1993 |
| WO | 2008138113 A1 | 11/2008 |

OTHER PUBLICATIONS

Wei-Yu Tsai, et al, A Novel Low Gate-Count Pipeline Topology With Multiplexer-Flip-Flops for Serial Link, IEEE Transactions on Circuits and Systems, Regular Papers, vol. 59, No. 11, Nov. 2012, pp. 2600-2610, 11 pages.

(Continued)

*Primary Examiner* — Diana J Cheng
(74) *Attorney, Agent, or Firm* — Parashos T. Kalaitzis; Amy J. Pattillo

(57) ABSTRACT

A logic unit is configured with least one multiplexor distributed along a delay path of a logic unit, wherein each at least one multiplexor is configured to receive two inputs and output one of the two inputs, wherein each at least one multiplexor is configured to select one of the two inputs to control a particular programmable number of clock cycles of delay added to a signal from 1 to N clock cycles. The logic unit is configured with at least two latches distributed along the delay path of the logic unit, wherein each at least one latch is configured to add a clock cycle of delay, wherein a terminating latch from among the at least two latches is configured to output the signal delayed by the particular programmable number of clock cycles.

15 Claims, 6 Drawing Sheets

(56) References Cited

OTHER PUBLICATIONS

Wei-Yu Tsai, et al. "A Novel MUX-FF Circuit for Low Power and High Speed Serial Link Interfaces", IEEE, Copyright 2010, pp. 4305-4308, 4 pages.

Tamhankar, Rutuparna R. et al, "Performance Driven Reliable Link Design for Networks on Chips", IEEE, Copyright 2005. pp. 749-754, 6 Pages.

Tamhankar, Rutuparna, "Terror: Reliable and Efficient Link Design for Network on Chips", Thesis, 2005, 62 Pages.

\* cited by examiner

DISTRIBUTING MULTIPLEXING LOGIC TO REMOVE MULTIPLEXOR LATENCY ON THE OUTPUT PATH FOR VARIABLE CLOCK CYCLE, DELAYED SIGNALS

TECHNICAL FIELD

The embodiment of the invention relates generally to delay logic for variable clock cycle delayed signals and particularly to distributing multiplexing logic to remove multiplexor latency, caused by propagation delays, on the output path for variable clock cycle, delayed signals.

DESCRIPTION OF THE RELATED ART

In digital logic design, an integrated circuit design may include a programmable N to 1 multiplexor that is used to choose between multiple, variable clock cycle, delayed signals to output a signal delayed by a certain number of clock cycles. As the number of delayed signals available for selection increases, the size of N increases, which also increases the complexity of logic required for the N to 1 multiplexor and increases the latency of the multiplexing logic used for outputting a selected delayed signal on the output path. In addition, as the frequency of an integrated circuit increases, the length of each clock cycle decreases, which increases the impact of any latency of the multiplexing logic on the output path for the selected delayed signal.

BRIEF SUMMARY

In view of the foregoing, there is a need for a method, system, and computer program product for distributing multiplexing logic to remove multiplexor latency on the output path for variable clock cycle, delayed signals.

In one embodiment, a logic unit of an integrated circuit is configured with least one multiplexor distributed along a delay path of a logic unit, wherein each at least one multiplexor is configured to receive two inputs and output one of the two inputs, wherein each at least one multiplexor is configured to select one of the two inputs to control a particular programmable number of clock cycles of delay added to a signal from 1 to N clock cycles, wherein the at least one multiplexor comprises N−1 multiplexors. The logic unit is configured with at least two latches distributed along the delay path of the logic unit, wherein each at least one latch is configured to add a clock cycle of delay, wherein the at least two latches comprises N latches, wherein the signal is initially simultaneously distributed both as input to a first latch of the at least two latches positioned in the delay path and as one of the two inputs to each at least one multiplexor, wherein a terminating latch from among the at least two latches is configured to output the signal delayed by the particular programmable number of clock cycles.

In another embodiment, a method for generating variable clock cycle, delay signals is directed to distributing at least one multiplexor along a delay path, wherein each at least one multiplexor receives two inputs and output one of the two inputs, wherein each at least one multiplexor selects one of the two inputs to control a particular programmable number of clock cycles of delay added to a signal from 1 to N clock cycles, wherein the at least one multiplexor comprises N−1 multiplexors. The method is directed to distributing at least two latches along the delay path, wherein each at least one latch is configured to add a clock cycle of delay, wherein the at least two latches comprises N latches, wherein the signal is initially simultaneously distributed both as input to a first latch of the at least two latches positioned in the delay path and as one of the two inputs to each at least one multiplexor,. The method is directed to outputting the signal delayed by the particular programmable number of clock cycles from a terminating latch from among the at least two latches.

BRIEF DESCRIPTION OF THE SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

Figure 1:
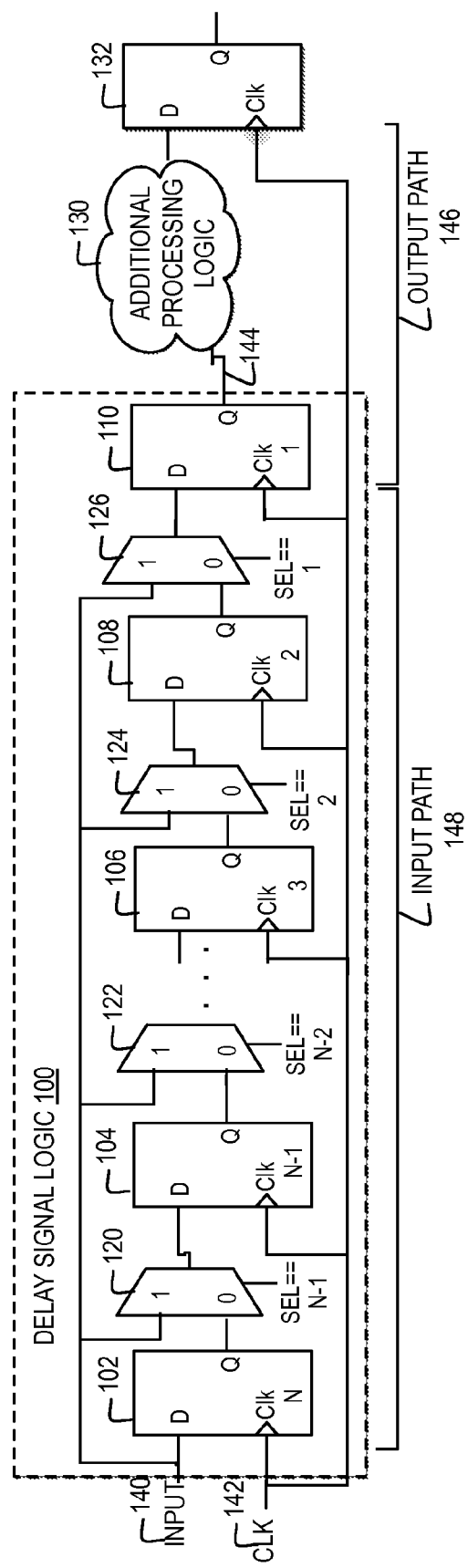
FIG. 1 illustrates a block diagram of one example of delay signal logic with multiplexing logic distributed to remove multiplexor latency on the output path for variable clock cycle, delayed signals.

FIG. 1 illustrates a block diagram of one example of delay signal logic with multiplexing logic distributed to remove multiplexor latency on the output path for variable clock cycle, delayed signals.

In the example, delay signal logic 100 receives an original input signal 140 and outputs input signal 140, delayed by 1 to N clock cycles, from a terminating latch 110, onto an output path 146, as delayed signal 144. In the example, N represents the maximum number of clock cycles by which the delayed signal 144 may be delayed from original input signal 140. In the example, the number of clock cycles by which original input signal 140 is delayed, between 1 and N, is programmable by setting a selector value to a value between 1 and N. In the example, delay signal logic 100 is illustrated implementing a forward direction circuit.

Figure 2:
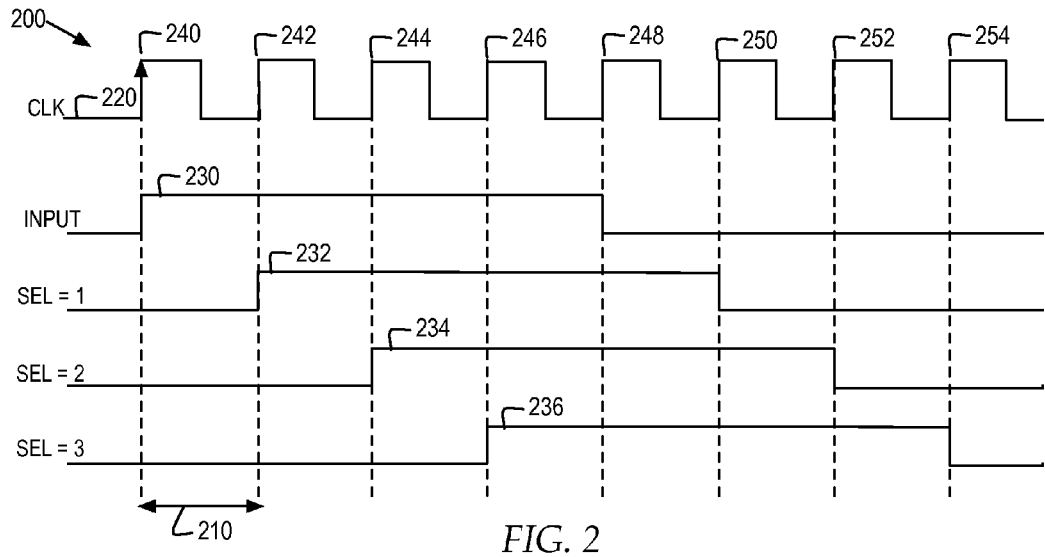
FIG. 2 illustrates one example of a timing diagram of programmable, variable clock cycle, delayed signals.

In one example, FIG. 2 illustrates a timing diagram of one example of programmable, variable clock cycle, delayed signals. In the example, a timing diagram 200 illustrates a clock signal CLK 220 with multiple clock cycles, such as a clock cycle 210 illustrated from a rising edge of CLK 220 until a next rising edge of CLK 220 starts. In the example, an original input signal 230 is illustrated, and for purposes of example, original input signal 230 logically rises from a 0 to a 1 at the rising edge of a clock cycle 240 and logically falls from a 1 to a 0 at the rising edge of a clock cycle 248.

In the example illustrated in FIG. 2, if a selector value is set to a value of 1, the signal 232, which is original input signal 230, delayed by one clock cycle, is selectively programmed to be available as delayed signal 144. In the example, signal 232 logically rises from a 0 to a 1 at the rising edge of a clock cycle 242, one clock cycle delayed from the rising edge of original input signal 230, and logically falls from a 1 to a 0 at the rising edge of a clock cycle 250, one clock cycle delayed from the falling edge of original input signal 230.

In the example illustrated in FIG. 2, if a selector value is set to a value of 2, the signal 234, which is original input signal 230, delayed by two clock cycles, is selectively programmed to be available as delayed signal 244. In the example, signal 234 logically rises from a 0 to a 1 at the rising edge of a clock cycle 244, two clock cycles delayed from the rising edge of original input signal 230, and logically falls from a 1 to a 0 at the rising edge of a clock cycle 252, two clock cycles delayed from the falling edge of original input signal 230.

In the example illustrated in FIG. 2, if a selector value is set to a value of 3, the signal 236, which is original input signal 230, delayed by three clock cycles, is selectively programmed to be available as delayed signal 244. In the example, signal 236 logically rises from a 0 to a 1 at the rising edge of a clock cycle 246, three clock cycles delayed from the rising edge of original input signal 230, and logically falls from a 1 to a 0 at the rising edge of a clock cycle 254, three clock cycles delayed from the falling edge of original input signal 230.

Returning to FIG. 1, in the example, for selecting one of the variable clock cycle, delayed signals as delayed signal 144, delay signal logic 100 includes multiple 2×1 multiplexers distributed along an input path 148, illustrated as multiplexor 120, multiplexor 122, multiplexor 124, and multiplexor 126. In the example, each of multiplexor 120, multiplexor 122, multiplexor 124, and multiplexor 126 receive two input signals labeled as input "1" and input "0", select one of the two inputs based on a selector input value, and output the selected input. In the example, a multiplexor may also refer to a data selector or a multiple-input, single-output switch. In the example, there is a latency associated with the propagation delay of the combinatorial logic of each of multiplexor 120, multiplexor 122, multiplexor 124 and multiplexor 126 receiving the two inputs, selecting one input, and outputting the selected input, however, the latency associated with the combinatorial logic for each 2×1 multiplexor is less than a clock cycle and does not impact the number of clock cycles by which a signal is delayed.

In the example, input path 148 of delay signal logic 100 may include N−1 multiplexors. Multiplexor 120, multiplexor 122, multiplexor 124, and multiplexor 126 are illustrated as one example of the distribution of multiplexors within delay signal logic. In one example, delay signal logic 100 may include additional multiplexors, for example, where N is greater than 4. In another example, delay signal logic 100 may also include fewer multiplexors than the multiplexors illustrated, for example, where N is 2 or 3.

In the example, each of multiplexor 120, multiplexor 122, multiplexor 124, and multiplexor 126 receive an input, labeled as input "1", of original input signal 140, without any delay. Delay signal logic 100 may implement N fanout circuits for distributing original input signal 140 to each of multiplexor 102, multiplexor 122, multiplexor 124, and multiplexor 126. In one example, the N fanout circuits are positioned such that original input signal 140 reaches each of multiplexor 120, multiplexor 122, multiplexor 124, and multiplexor 126 before the next rising edge of a clock signal so that the fanout circuits do not delay the arrival of original input signal 140 by a clock cycle.

In the example, each of multiplexor 120, multiplexor 122, multiplexor 124, and multiplexor 126 also receive an input, labeled as input "0", which is the output from the latch distributed before each multiplexor. In the example, in the signal path within delay signal logic 100, a latch 102 is distributed before multiplexor 120, a latch 104 is distributed before multiplexor 122, a latch 106 is distributed before multiplexor 124, and a latch 126 is distributed before multiplexor 126.

In the example, each of latch 102, latch 104, latch 106, latch 108, and terminating latch 110 delays a signal received as input D by one clock cycle by outputting the received input D, as output Q, in synchronization with a clock signal CLK. For purposes of example, each of latch 102, latch 104, latch 106, latch 108 and terminating latch 110 are described herein as outputting the value of input D at the rising edge of the clock signal as output Q. In other examples, one or more latches may be set to output the value of input D in synchronization with other portions of the clock signal as output Q.

In the example, each of multiplexor 120, multiplexor 122, multiplexor 124, and multiplexor 126 uses a selector input to select, for output from the multiplexor, the input labeled as "1" or the input labeled as "0". In the example, each of multiplexor 120, multiplexor 122, multiplexor 124, and multiplexor 126 implements a fixed comparator for each selector input, labeled as "sel", where the fixed comparator for each multiplexor is set to a different value from N−1 to 1, from the first multiplexor in the signal path in delay signal logic 100 to the last multiplexor in the signal path in delay signal logic 100. For example, the fixed comparator value for the first multiplexor in the signal path, multiplexor 120, is set to N−1, the fixed comparator value for the next multiplexor in the signal path, multiplexor 122, is set to N−2, the fixed comparator value for the subsequent multiplexor in the signal path, multiplexor 124, is set to 2, and the fixed comparator value for the last multiplexor in the signal path, multiplexor 126, is set to 1.

In the example, the selector value received as the selector input SEL to each multiplexor is programmable to specify the particular number of delay clock cycles from among the N variable clock cycle, delayed signals. In the example, if the selector value received as selector input SEL of a multiplexor matches the fixed comparator value for the multiplexor, the multiplexor selects to output the input labeled as "1", which is an input of original input signal 140. In the example, if the selector value received as selector input SEL of a multiplexor does not match the fixed comparator value for the multiplexor, the multiplexor selects to output the input labeled as "0", which is the delayed signal received from the latch distributed before the multiplexor.

In the example, if the selector value is set to N, the selector input SEL of N does not match a fixed comparator value of any of the multiplexors, therefore each of multiplexor 120, multiplexor 122, multiplexor 124, and multiplexor 124 are set to select the input labeled as "0". In the example, if the selector value is set to N, the selected delay signal path includes original input signal 140 passing through latch 102 on a rising clock edge and then through multiplexor 120 before the next rising clock edge. The signal output from multiplexor 120 passes through latch 104 on a next rising clock edge and through multiplexor 122 before the subsequent rising clock edge. The signal output from multiplexor 122 passes through latch 106 on a next rising clock edge and then through multiplexor 124 before the subsequent rising clock edge. The signal output from multiplexor 124 passes through latch 108 on a next rising clock edge and through multiplexor 126 before the subsequent rising clock edge. The signal output from multiplexor 126 passes through latch 110 on a next rising clock edge, as delayed signal 144. In the example, a delay clock cycle is added to original input signal 140 at each of latch 102, latch 104, latch 106, latch 108, and latch 110. In particular, in the example, if the selector value is set to N, the delayed signal 144 is original input signal 140, delayed by N clock cycles.

In the example, if the selector value is set to N−1, the selector input SEL of N−1 matches the fixed comparator value of multiplexor 120, therefore multiplexor 120 is set to select the input labeled as "1", which is original input signal 140, and multiplexor 122, multiplexor 124, and multiplexor 126 are set to select the input labeled as "0". In the example, if the selector value is set to N−1, the selected delay signal path includes original input signal 140 passing through multiplexor 120 to latch 104 before a rising clock edge, which passes through latch 104 on the rising clock edge and then through multiplexor 122 before the next rising clock edge. The signal output from multiplexor 122 passes through latch 106 on a next rising clock edge and through multiplexor 124 before the subsequent rising clock edge. The signal output from multiplexor 124 passes through latch 108 on a next rising clock edge and then through multiplexor 126 before the subsequent rising clock edge. The signal output from multiplexor 126 passes through latch 110 on a next rising clock edge, as delayed signal 144. In the example, a delay clock cycle is added to original input signal 140 at each of latch 104, latch 106, latch 108, and latch 110. In particular, in the example, if the selector value is set to N−1, the delayed signal 144 is original input signal 140, delayed by N−1 clock cycles.

In the example, if the selector value is set to N−2, the selector input SEL of N−2 matches the fixed comparator value of multiplexor 122, therefore multiplexor 122 is set to select the input labeled as "1", which is original input signal 140, and multiplexor 124 and multiplexor 126 are set to select the input labeled as "0". In the example, if the selector value is set to N−2, the selected delay signal path includes original input signal 140 passing through multiplexor 122 to latch 106 before a rising clock edge, passing through latch 106 on a rising clock edge and then through multiplexor 124 before the next rising clock edge. The signal output from multiplexor 124 passes through latch 108 on a next rising clock edge and through multiplexor 126 before a subsequent rising clock edge. The signal output from multiplexor 126 passing through latch 110 on a next rising clock edge, as delayed signal 144. In the example, a delay clock cycle is added to original input signal 140 at each of latch 106, latch 108, and latch 110. In particular, in the example, if the selector value is set to N−2, the delayed signal 144 is original input signal 140, delayed by N−2 clock cycles.

In the example, if the selector value is set to 2, the selector input SEL of 2 matches the fixed comparator value of multiplexor 124, therefore multiplexor 124 is set to select the input labeled as "1", which is original input signal 140, and multiplexor 126 is set to select the input labeled as "0". In the example, if the selector value is set to 2, the selected delay signal path includes original input signal 140 passing through multiplexor 124 to latch 108 before a rising clock edge, passing through latch 108 on the rising clock edge and then through multiplexor 126 before the next rising clock edge. The signal output from multiplexor 126 passes through latch 110 on a next rising clock edge, as delayed signal 144. In one example, the signal output through latch 110 is illustrated by signal 234 in FIG. 2. In the example, a delay clock cycle is added to original input signal 140 at each of latch 108 and latch 110. In particular, in the example, if the selector value is set to 2, delayed signal 144 is original input signal 140, delayed by 2 clock cycles.

In the example, if the selector value is set to 1, the selector input SEL of 1 matches the fixed comparator value of multiplexor 126, therefore multiplexor 126 is set to select the input labeled as "1", which is original input signal 140. In the example, if the selector value is set to 1, the selected delay signal path includes original input signal 140 passing through multiplexor 126 to latch 110 before a rising clock edge and passing through latch 110 on the rising clock edge, as delayed signal 144. In the example, a delay clock cycle is added to original input signal 140 at latch 110. In one example, the signal output through latch 110 is illustrated by signal 232 in FIG. 2. In particular, in the example, if the selector value is set to 1, delayed signal 144 is original input signal 140, delayed by 1 clock cycle.

In the example, performance requirements may specify that the logic implemented to add each clock cycle of delay to a signal not introduce additional latency reaching an amount that would introduce additional clock cycles of delay to a signal within input path 148. As illustrated, for each clock cycle, the latency of a signal passing from the output one latch as input to a next latch, through a 2×1 multiplexor, is less than one clock cycle. Therefore, through the distribution of N−1 2×1 multiplexors, each set to select input "1" on a separate fixed comparator value, the impact of the latency, through propagation delays, introduced by the N−1 2×1 multiplexors in delay signal logic 100, is minimal and does not reach an amount that would introduce additional clock cycles of delay to a signal within input path 148. In addition, the latency introduced by the propagation delays of the combinatorial logic of N−1 2×1 multiplexors distributed in delay signal logic 100 does not introduce additional clock cycles of delay to a signal regardless of whether N is 2 or N is very large.

In addition, in the example, performance requirements may limit the time required to perform the logic in the portion of the signal path illustrated as output path 146, to one clock cycle. In the example, output path 146 includes the logic required to output delayed signal 144, perform additional processing logic 130 and pass the processed, delayed signal, to a latch 132. In the example, the multiplexor logic is distributed within delay signal logic 100 such that delayed signal 144 is output on the rising edge of a clock cycle, from terminating latch 110. In particular, in the example, the multiplexor logic is distributed in delay signal logic 100 on the input path of the signals to be delayed, so that no multiplexor logic latency impacts output path 146.

In addition, in the example, delay signal logic 100 may be implemented in an integrated circuit operating at a high frequency, requiring fast clock cycles. In one example, if an integrated circuit operates at a frequency of 1 gigahertz (GHz), then each clock cycle may be limited to 1 nanosecond. In this example, the amount of time allowed for adding each clock cycle of delay to a signal within input path 148 is limited to 1 nanosecond and the amount of time allowed for performing the logic in output path 146 is also limited to one nanosecond. By distributing the multiplexor logic required for generating variable clock cycle delay signals in delay signal logic 100 into N−1 2×1 multiplexors within input path 148, the propagation delays of the multiplexor logic required are also distributed throughout multiple clock cycles, allowing for input path 148 to handle clock cycle speeds that do not exceed that latency of a single 2×1 multiplexor, whether N is 2 or N is very large.

In the example, a user programs a selector value for delay signal logic 100 to select from among N variably-delayed clocked signals produced by latches, which are clocked delay elements, and does not include unclocked delay elements. In other examples, delay signal logic 100 may also include unclocked delay elements. In addition, in the example, delay signal logic 100 implements latches as clocked delay elements, and does not include inverters or delay chains, however, in other examples, delay signal logic 100 may also include inventers or daisy chains for producing delay elements.

Figure 3:
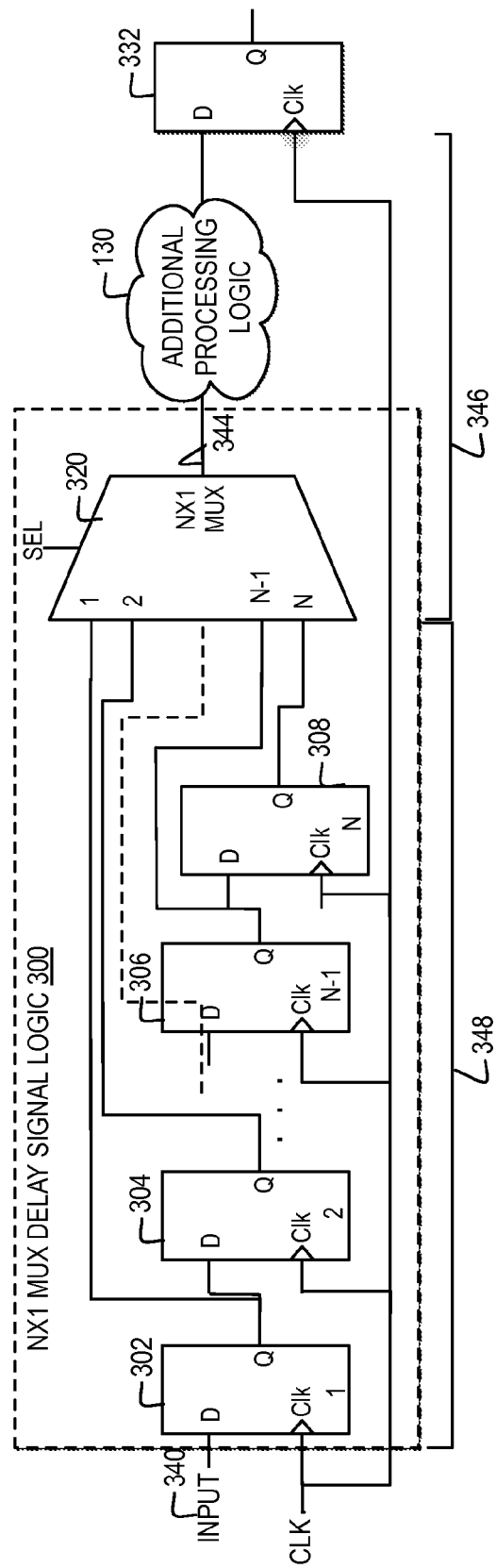
FIG. 3 illustrates a block diagram of one example of delay signal logic implementing a single N to 1 multiplexor for generating variable clock cycle, delayed signals, where the N to 1 multiplexor introduces latency on the output path for variable clock cycle, delayed signals.

FIG. 3 illustrates a block diagram of one example of delay signal logic implementing a single N to 1 multiplexor for generating variable clock cycle, delayed signals, where the N to 1 multiplexor introduces latency on the output path for variable clock cycle, delayed signals. In the examples, while delay signal logic 100 distributes N−1 2×1 multiplexors within input path 148 to remove any multiplexor logic latency on output path 146, N×1 mux delay signal logic 300, in contrast, implements complex multiplexor logic of a single N×1 multiplexor 320, which introduces latency on an output path 346. In the example, output path 346 includes N×1 multiplexor 320 and additional processing logic 130, with a clock cycle allocated for performing all the logic in output path 346 and the resulting signal reaching a latch 332. In particular, the latency of performing the combinatorial logic of N×1 multiplexor 320 uses a portion of the clock cycle allotted for performing all the logic in output path 346 and the resulting signal reaching latch 332.

As the size of N increases, in N×1 mux delay signal logic 300, the complexity of the combinatorial logic of N×1 multiplexor 320 increases and the propagation delays introduced by N×1 multiplexor 320 on output path 346 also increases. As the propagation delays introduced by N×1 multiplexor 320 on output path 346 increases, the portion of the clock cycle remaining for performing additional processing logic 130 within terminating path 346 decreases. In addition, as the length of a clock cycle decreases, in N×1 mux delay signal logic 300, the impact of any propagation delays introduced by N×1 multiplexor 320 on output path 346 increases, whether N is small or large, because the proportion of the portion of the clock cycle remaining for performing additional processing logic 130 decreases.

In particular, in the example, N×1 mux delay signal logic 300 receives an original input signal 340 and outputs input signal 340, delayed by 1 to N clock cycles, from an N×1 multiplexor 320, as delayed signal 344. In the example, N represents the maximum number of clock cycles by which the delayed signal 344 may be delayed from original input signal 340. In the example, the number of clock cycles by which original input signal 340 is delayed, between 1 and N, is variably programmable by setting a selector value.

In the example, N×1 mux delay signal logic 300 includes N×1 multiplexor 320, which receives N inputs, where each input represents original input signal 340 delayed by a different number of clock cycles. In the example, an input path 348 includes latch 302, latch 304, latch 306, and latch 308 distributed along the signal path to generate multiple, variable clock cycle delay signals, from original input signal 340. For example, latch 302 passes original input signal 340 on the rising clock edge, with one clock cycle delay, to N×1 multiplexor 320 as the input for the 1 clock cycle delay selector and to latch 304, as input for latch 304 to pass on the next rising clock edge, with two clock cycles delay, to N×1 multiplexor 320 as the input for the 1 clock cycle delay selector and to latch 306, as input for latch 306 to pass on the next rising clock edge, with N−1 clock cycles delay, to N×1 multiplexor as the input for the N−1 clock cycles delay selector and to latch 308, as input for latch 308 to pass on the next rising clock edge, with N clock cycles delay, to N×1 multiplexor 320 as the input for the N clock cycle delay selector. In the example, the selector value is used as the input SEL to N×1 multiplexor 320 for selecting which of the N delayed signals to output from N×1 multiplexor 320 as delayed signal 344.

In the example, in N×1 mux delay signal logic 300, all of the multiplexor logic is combined into N×1 multiplexor 320, which is complex, combinatorial logic that requires a portion of a clock cycle allocated to output path 346, to select and output a delayed signal 344. Thus, whether N is 2 or 40, the latency of N×1 multiplexor 320 impacts output path 346.

In a comparison of delay signal logic 100 with N×1 mux delay signal logic 300, the delay logic is similar in that both selections of delay signal logic generate a variable clock cycle, delayed signal, as selected by a selector value. In addition, in a comparison of delay signal logic 100 with N×1 mux delay signal logic 300, the delay logic is similar in that both selections of delay signal logic distribute latches within an input path, where the latches effectively add clock cycles of delay to an original input signal. In the example, delay signal logic 100 and N×1 mux delay signal logic 300 differ in that the multiplexor logic in delay signal logic 100 is distributed into N−1 2×1 multiplexors throughout input path 148 where the latency of the N−1 2×1 multiplexors has no impact on output path 146, but the multiplexor logic in N×1 mux delay signal logic 300 is consolidated into a single N×1 multiplexor where the latency of the N×1 multiplexor impacts output path 346. While the performance impact from the latency of N×1 multiplexor 320 on output path 346 may not degrade performance until N reaches a threshold size, the latency of N×1 multiplexor 320 still impacts output path 346, while none of the latency of the multiplexor logic of delay signal logic 100 impacts output path 146.

In the example, delay signal logic 100 may be selected for use in an integrated circuit, in lieu of delay signal logic 300, because while both delay signal logic provide programmable variable clock cycle, delay signals, delay signal logic 100 distributes 2 to 1 multiplexors to replace the N to 1 multiplexor in delay signal logic 300, to avoid the propagation delays of the N to 1 multiplexor, which impact integrated circuit performance.

Figure 4:
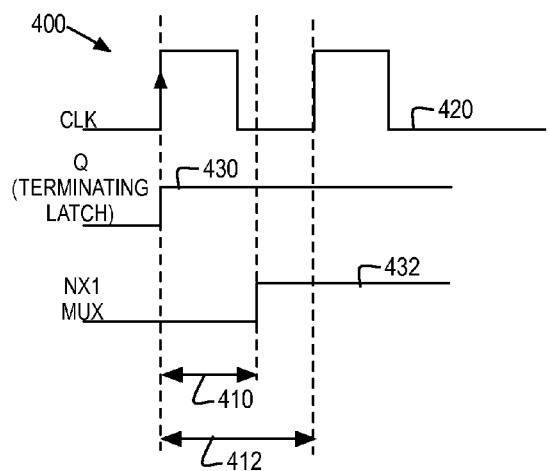
FIG. 4 illustrates one example a timing diagram comparing an output of a delayed signal from a terminating latch of delay signal logic with distributed multiplexor logic with an output of a delayed signal from an N×1 multiplexor of delay signal logic.

FIG. 4 illustrates one example of a timing diagram comparing an output of a delayed signal from a terminating latch of delay signal logic with distributed multiplexor logic with an output of a delayed signal from an N×1 multiplexor of delay signal logic. In the example, a timing diagram 400 includes a clock signal CLK 420, where a one clock cycle period is illustrated at reference numeral 412 from a rising edge of the clock cycle to the start of a rising edge of a next clock cycle.

In the example, a signal 430 illustrates the output Q from terminating latch 110 of delay signal logic 100. In the example, the output Q from terminating latch 110 is delayed signal 144, representing original input signal 140, delayed by a particular number of clock cycles as programmed by a selection of a selector value. In the example, output Q from terminating latch 110 is output as delayed signal 144 on the rising edge of clock signal 420 for clock cycle 412. There is no latency added to output path 146 by the output of delayed signal 144 on output path 146. In addition, there is no latency added to output path 146 by any of the multiplexor logic of delay signal logic 100.

In the example, a signal 432 illustrates the output from N×1 multiplexor 320 of N×1 mux delay signal logic 300. In the example, the output from N×1 multiplexor 320 is delayed signal 344, representing original input signal 340, delayed by a particular number of clock cycles as programmed by a selection of a selector value. In the example, the output from N×1 multiplexor 320 is output as delayed signal 344 at some point after the rising edge of clock signal 420, after the combinatorial logic of N×1 multiplexor 320 completes. For example, the combinatorial logic of N×1 multiplexor 320 may require the portion of clock cycle 412 illustrated by latency 410. N×1 multiplexor 320 adds latency 410, representing the latency required for completing multiplexor logic, to output path 346.

In the example, if delay signal logic 100 is implemented, with delayed signal 144 output on the rising edge of clock cycle 412, as illustrated by signal 430, the entire portion of clock cycle 412 is available for performing additional processing logic 130 and the other logic on output path 146. In the example, if delay signal logic 100 is implemented, N can be small or large and delayed signal 144 is still output on the rising edge of clock cycle 412, with minimal to no latency impact on output path 146. In the example, if delay signal logic 100 is implemented, regardless of the length of clock cycle 412, delayed signal 144 is still output on the rising edge of clock cycle 412, with minimal to no latency impact on output path 146.

In the example, if N×1 mux delay signal logic 300 is implemented, with delayed signal 344 output from N×1 multiplexor 320 delayed by latency 410 of the combinatorial logic of N×1 multiplexor 320, then only the portion of clock cycle 412 following latency 410 is available for performing additional processing logic 130 and other logic on output path 346. In the example, if N×1 mux delay signal logic 300 is implemented, as N increases, the length of latency 410 increases within clock cycle 412 and the latency impact on output path 146 increases. In the example, if N×1 mux delay signal logic 300 is implemented, as the length of clock cycle 412 is reduced, the proportional impact of the length of latency 410 on the portion of clock cycle 412 remaining for performing additional processing logic 130 and other logic on output path 346, also increases.

Figure 5:
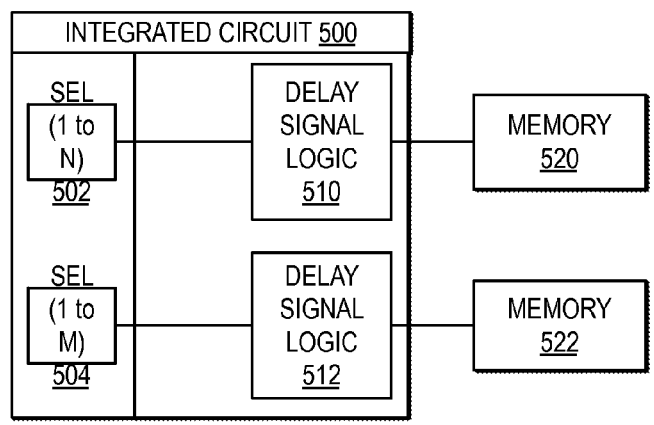
FIG. 5 illustrates a block diagram of one example of an integrated circuit with programmable delay signal logic for generating variable clock cycle, delayed signals for output to one or more memory chips.

FIG. 5 illustrates a block diagram of one example of an integrated circuit with programmable delay signal logic for generating variable clock cycle, delayed signals for output to one or more memory chips. In the example, an integrated circuit 500 includes programmable registers for programming the selector value for each set of delay signal logic within integrated circuit 500. In the example, an integrated circuit 500 includes at least one set of delay signal logic, such as delay signal logic 510 and delay signal logic 512, for controlling the delay of signals output to one or more memory chips, such as memory 520 and memory 522.

In the example, a selector (SEL) register 502 is set to a selector value for delay signal logic 510, where SEL register 502 is set to a selector value from 1 to N, where N is the maximum number of delay clock cycles in a signal in delay signal logic 510. In the example, a SEL register 504 is set to a selector value for delay signal logic 512, where SEL register 504 is set to a selector value from 1 to M, where M is the maximum number of delay clock cycles in a signal in delay signal logic 512. In one example, N and M are equal, when delay signal logic 510 and delay signal logic 512 provide a same number of variable clock cycle, delay signals. In another example, N and M are not equal, when delay signal logic 510 and delay signal logic 512 provide different numbers of variable clock cycle, delay signals.

In the example, to build additional functionality into integrated circuit 500, one or more of delay signal logic 510 and delay signal logic 512 may be designed where N or M is large, such as where N is 40, such that integrated circuit 500 can be programmed to work with multiple types of memory chips, with a broad range of delay clock cycles required. In the example, delay signal logic 510 and delay signal logic 512 may implement delay signal logic 100, such that whether N is small or large and whether the operating frequency of integrated circuit 500 is fast or slow, no latency from multiplexor logic within delay signal logic 510 and delay signal logic 512 impacts the output path of delayed signals output from delay signal logic 510 and delay signal logic 512.

In one example, each of SEL register 502 and SEL register 504 are programmed with selector values and the selector values remain static during the operation of integrated circuit 500. When selector values remain static during the operation of integrated circuit 500, the delayed signal generated by each of delay signal logic 510 and delay signal logic 512 remains available for use after an initialization period set to the number of clock cycles specified in the SEL register.

In another example, one or more of SEL register 502 and SEL register 504 are programmed with selector values, but the selector values may be dynamically adjusted during the operation of integrated circuit 500. When selector values are dynamically programmed during the operation of integrated circuit 500, the delayed signal generated by the reprogrammed delay signal logic is not available for use until after a new initialization period set to the number of clock cycles specified in the reprogrammed SEL register.

Figure 6:
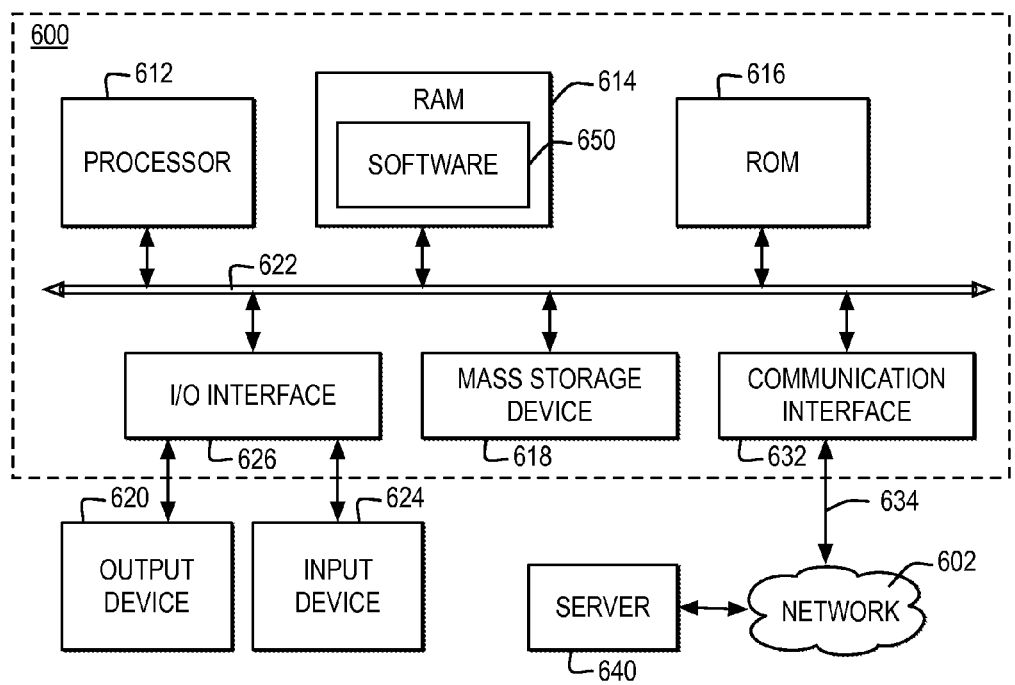
FIG. 6 illustrates a block diagram of one example of a computer system in which one embodiment of the invention may be implemented.

FIG. 6 illustrates a block diagram of one example of a computer system in which one embodiment of the invention may be implemented. The present invention may be performed in a variety of systems and combinations of systems, made up of functional components, such as the functional components described with reference to a computer system 600 and may be communicatively connected to a network, such as network 602.

Computer system 600 includes a bus 622 or other communication device for communicating information within computer system 600, and at least one hardware processing device, such as processor 612, coupled to bus 622 for processing information. Bus 622 preferably includes low-latency and higher latency paths that are connected by bridges and adapters and controlled within computer system 600 by multiple bus controllers. When implemented as a server or node, computer system 600 may include multiple processors designed to improve network servicing power. Where multiple processors share bus 622, additional controllers (not depicted) for managing bus access and locks may be implemented.

Processor 612 may be at least one general-purpose processor such as IBM® PowerPC® processor that, during normal operation, processes data under the control of software 650, which may include at least one of application software, an operating system, middleware, and other code and computer executable programs accessible from a dynamic storage device such as random access memory (RAM) 614, a static storage device such as Read Only Memory (ROM) 616, a data storage device, such as mass storage device 618, or other data storage medium. Software 650 may include, but is not limited to, code, applications, protocols, interfaces, and processes for controlling one or more systems within a network including, but not limited to, an adapter, a switch, a server, a cluster system, and a grid environment.

Figure 7:
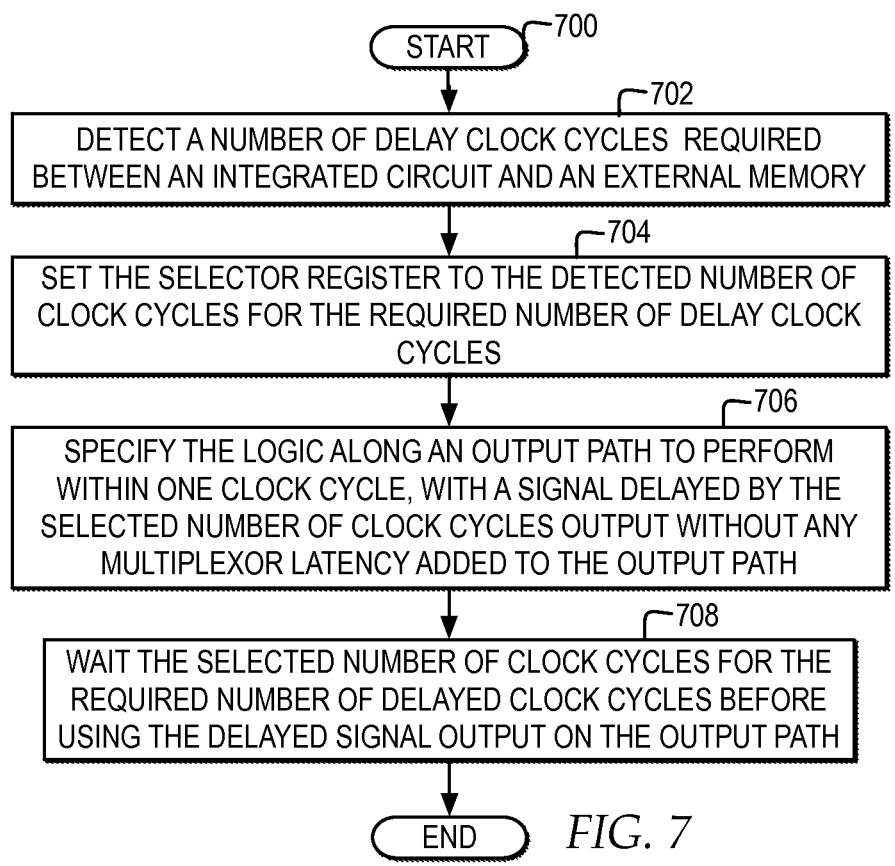
FIG. 7 illustrates a high level logic flowchart of a process and program for selectively programming the particular delay signal from variable clock cycle, delay signals for delay signal logic comprising distributed multiplexor logic to remove any multiplexor logic latency on the output path of the particular delay signal.
Figure 8:
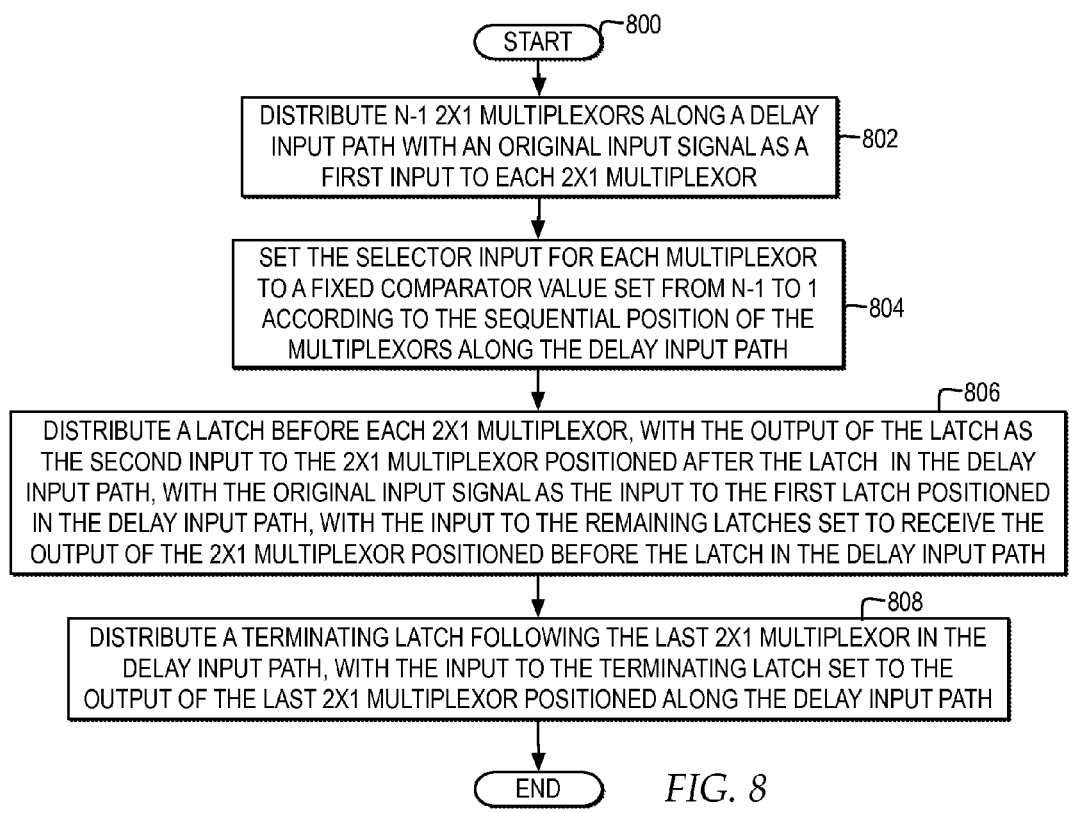
FIG. 8 illustrates a high level logic flowchart of a process and program for distributing multiplexor logic in delay signal logic to remove any multiplexor logic latency on the output path of the variable clock cycle, delayed signals.

In one embodiment, the operations performed by processor 612 may control the operations of flowchart of FIGS. 7 and 8 and other operations described herein. Operations performed by processor 612 may be requested by software 650 or other code or the steps of one embodiment of the invention might be performed by specific hardware components that contain hardwired logic for performing the steps, or by any combination of programmed computer components and custom hardware components. In one embodiment, one or more components of computer system 600, or other components, which may be integrated into one or more components of computer system 600, may contain hardwired logic for implementing delay signal logic 100 and for performing the operations of flowcharts FIGS. 7 and 8.

Those of ordinary skill in the art will appreciate that aspects of one embodiment of the invention may be embodied as a system, method or computer program product. Accordingly, aspects of one embodiment of the invention may take the form of an entirely hardware embodiment, an entirely software embodiment (including firmware, resident software, microcode, etc.) or an embodiment containing software and hardware aspects that may all generally be referred to herein as "circuit," "module," or "system." Furthermore, aspects of one embodiment of the invention may take the form of a computer program product embodied in one or more tangible computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, such as mass storage device 618, a random access memory (RAM), such as RAM 614, a read-only memory (ROM) 616, an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction executing system, apparatus, or device.

A computer readable signal medium may include a propagated data signal with the computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction executable system, apparatus, or device.

Program code embodied on a computer readable medium may be transmitted using any appropriate medium, including but not limited to, wireless, wireline, optical fiber cable, radio frequency (RF), etc., or any suitable combination of the foregoing.

Computer program code for carrying out operations of on embodiment of the invention may be written in any combination of one or more programming languages, including an object oriented programming language such as Java™, Smalltalk, C++ or the like and conventional procedural programming languages, such as the "C" programming language or similar programming languages. The program code may execute entirely on the user's computer, such as computer system 600, partly on the user's computer, as a stand-alone software package, partly on the user's computer and partly on a remote computer or entirely on the remote computer or server, such as server 640. In the latter scenario, the remote computer may be connected to the user's computer through any type of network, such as network 602, through a communication interface, such as network interface 632, over a network link that may be connected, for example, to network 602.

In the example, network interface 632 includes an adapter 634 for connecting computer system 600 to network 602 through a link and for communicatively connecting computer system 600 to server 640 or other computing systems via network 602. Although not depicted, network interface 632 may include additional software, such as device drivers, additional hardware and other controllers that enable communication. When implemented as a server, computer system 600 may include multiple communication interfaces accessible via multiple peripheral component interconnect (PCI) bus bridges connected to an input/output controller, for example. In this manner, computer system 600 allows connections to multiple clients via multiple separate ports and each port may also support multiple connections to multiple clients.

One embodiment of the invention is described below with reference to flowchart illustrations and/or block diagrams of methods, apparatus (systems) and computer program products according to embodiments of the invention. Those of ordinary skill in the art will appreciate that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, such as computer system 600, or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer, such as computer system 600, or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Network interface 632, the network link to network 602, and network 602 may use electrical, electromagnetic, or optical signals that carry digital data streams. The signals through the various networks and the signals on network 602, the network link to network 602, and network interface 632 which carry the digital data to and from computer system 600, may be forms of carrier waves transporting the information.

In addition, computer system 600 may include multiple peripheral components that facilitate input and output. These peripheral components are connected to multiple controllers, adapters, and expansion slots, such as input/output (I/O) interface 626, coupled to one of the multiple levels of bus 622. For example, input device 624 may include, for example, a microphone, a video capture device, an image scanning system, a keyboard, a mouse, or other input peripheral device, communicatively enabled on bus 622 via I/O interface 626 controlling inputs. In addition, for example, output device 620 communicatively enabled on bus 622 via I/O interface 626 for controlling outputs may include, for example, one or more graphical display devices, audio speakers, and tactile detectable output interfaces, but may also include other output interfaces. In alternate embodiments of the present invention, additional or alternate input and output peripheral components may be added.

Those of ordinary skill in the art will appreciate that the hardware depicted in FIG. 6 may vary. Furthermore, those of ordinary skill in the art will appreciate that the depicted example is not meant to imply architectural limitations with respect to the present invention.

FIG. 7 illustrates a high level logic flowchart of a process and program for selectively programming the particular delay signal from variable clock cycle, delay signals for delay signal logic comprising distributed multiplexor logic to remove any multiplexor logic latency on the output path of the particular delay signal. In the example, the process starts at block 700 and thereafter proceeds to block 702. Block 702 illustrates detecting a number of delay clock cycles required between an integrated circuit and an external memory chip. Next, block 704 illustrates setting the selector register to the detected number of clock cycles for the required number of delay clock cycles. Thereafter, block 706 illustrates specifying the logic along an output path to perform within one clock cycle, with the signal delayed by the selected number of clock cycles output without any multiplexor latency added to the output path. Next, block 708 illustrates waiting the selected number of clock cycles for the required number of delay clock cycles before using the delayed signal output on the output path, and the process ends.

FIG. 8 illustrates a high level logic flowchart of a process and program for distributing multiplexor logic in delay signal logic to remove any multiplexor logic latency on the output path of the variable clock cycle, delayed signals. In the example, the process starts at block 800 and thereafter proceeds to block 802. Block 802 illustrates distributing N−1 2×1 multiplexors along a delay input path with an original input signal as a first input to each 2×1 multiplexor. Next, block 804 illustrates setting the selector input for each multiplexor to a fixed comparator value set from N−1 to 1 according to the sequential position of the multiplexors along the delay input path. Thereafter, block 806 illustrates distributing a latch before each 2×1 multiplexor, with the output of the latch as the second input to the 2×1 multiplexor positioned after the latch in the delay input path, with the original input signal as the input to the first latch positioned in the delay input path, with the input to the remaining latches set to receive the output of the 2×1 multiplexor positioned before the latch in the delay input path. Next, block 808 illustrates distributing a terminating latch following the last 2×1 multiplexor in the delay input path, with the input to the terminating latch set to the output of the last 2×1 multiplexor positioned along the delay input path.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A logic unit, comprising:
at least one multiplexor distributed along a delay path of a logic unit, wherein each at least one multiplexor is configured to receive two inputs and output one of the two inputs, wherein each at least one multiplexor is configured to select one of the two inputs to control a particular programmable number of clock cycles of delay added to a signal from 1 to N clock cycles, wherein the at least one multiplexor comprises N−1 multiplexors; and
at least two latches distributed along the delay path of the logic unit, wherein each at least one latch is configured to add a clock cycle of delay, wherein the at least two latches comprises N latches, wherein the signal is initially simultaneously distributed both as input to a first latch of the at least two latches positioned in the delay path and as one of the two inputs to each at least one multiplexor, wherein a terminating latch from among the at least two latches is configured to output the signal delayed by the particular programmable number of clock cycles.

2. The system according to claim 1, further comprising:
a selector register of the logic unit configured to store a value specifying the particular programmable number of clock cycles of delay; and
each at least one multiplexor comprising a selector input configured to select one of the two inputs each based a separate fixed comparator result of the particular programmable number with a separate number from 1 to N−1 clock cycles.

3. The system according to claim 1, further comprising:
the terminating latch configured to output the signal delayed by the particular programmable number of clock cycles on a rising edge of a clock signal.

4. The system according to claim 1, further comprising:
the terminating latch configured to output the signal delayed by the particular programmable number of clock cycles on a rising edge of a clock signal onto an output path configured with additional processing logic to be performed within a clock cycle, wherein the clock cycle starts at the rising edge of the clock signal.

5. The system according to claim 4, wherein a latency of the combinatorial logic of at least one multiplexor does not add any delay to the output path.

6. The system according to claim 1, wherein the at least one multiplexor is a single multiplexor configured to receive two inputs and output one of the two inputs only if N is equal to 2.

7. The system according to claim 1, wherein the at least one multiplexor distributed is an N to 1 multiplexor only if N is equal to 2.

8. The system according to claim 1, further comprising:
the output of each of the at least two latches other than the terminating latch received as one of the two inputs to a separate multiplexor from among the at least one multiplexor.

9. The system according to claim 1, further comprising:
the logic unit configured to control output of the delayed signal from an integrated circuit to at least one external memory; and
the particular programmable number of clock cycles of delay added to a signal from 1 to N clock cycles programmed to a required number of clock cycles of delay from the integrated circuit to the least one external memory.

10. The system according to claim 1, further comprising:
the logic unit configured, responsive to a selector register of the logic unit loaded with an updated value, to dynamically reset the particular programmable number of clock cycles of delay to equal the updated value; and
the delayed signal available for use on the output path after a number of clock cycles equal to the updated value.

11. A method for generating variable clock cycle, delay signals, comprising:
distributing at least one multiplexor along a delay path, wherein each at least one multiplexor receives two inputs and output one of the two inputs, wherein each at least one multiplexor selects one of the two inputs to control a particular programmable number of clock cycles of delay added to a signal from 1 to N clock cycles, wherein the at least one multiplexor comprises N−1 multiplexors;
distributing at least two latches along the delay path, wherein each at least one latch is configured to add a clock cycle of delay wherein the at least two latches comprises N latches, wherein the signal is initially simultaneously distributed both as input to a first latch of the at least two latches positioned in the delay path and as one of the two inputs to each at least one multiplexor; and
outputting the signal delayed by the particular programmable number of clock cycles from a terminating latch from among the at least two latches.

12. The method according to claim 11, further comprising
loading a selector register with a value specifying the particular programmable number of clock cycles of delay; and
selecting, for each at least one multiplexor, one of the two inputs based on a separate fixed comparator result of the particular programmable number with a separate number from 1 to N−1 clock cycles.

13. The method according to claim 11, further comprising:
outputting the signal delayed by the particular programmable number of clock cycles from the terminating latch on a rising edge of a clock signal.

14. The method according to claim 11, further comprising:
outputting the signal delayed by the particular programmable number of clock cycles from the terminating latch on a rising edge of a clock signal onto an output path configured with additional processing logic to be performed within a clock cycle, wherein the clock cycle starts at the rising edge of the clock signal.

15. The method according to claim 11, further comprising:
receiving the output of each of the at least two latches other than the terminating latch as one of the two inputs to a separate multiplexor from among the at least one multiplexor.

* * * * *